SEMICONDUCTOR DIFFERENTIAL AMPLIFIER PROVIDING NO LEVEL SHIFT BETWEEN THE INPUT AND OUTPUT SIGNAL LEVELS

Filed July 20, 1967

United States Patent Office 3,510,791
Patented May 5, 1970

3,510,791

SEMICONDUCTOR DIFFERENTIAL AMPLIFIER PROVIDING NO LEVEL SHIFT BETWEEN THE INPUT AND OUTPUT SIGNAL LEVELS

Minoru Nagata, Kodaira-shi, Japan, assignor to Hitachi, Ltd., Tokyo-to, Japan

Filed July 20, 1967, Ser. No. 654,724
Claims priority, application Japan, July 20, 1966, 41/47,030
Int. Cl. H03f 3/68
U.S. Cl. 330—30 16 Claims

ABSTRACT OF THE DISCLOSURE

A semiconductor differential amplifier in which a pair of amplifying transistors which have the same constructions and characteristics, are connected together by their emitters, which are connected through a common emitter resistor to a bias voltage source. The base of one of the transistors is grounded, and the base of the other transistor is supplied with an input signal. A load resistor whose resistance is twice as large as that of the emitter resistor is connected in series with a PN junction diode whose junction is formed in the same operation as the emitter-base junctions of the pair of transistors. The series circuit thus comprised is inserted in one of the collector circuits of the pair of transistors, so that no level shift is provided between the input and output signals under conditions where two voltages of the same amount but of opposite polarities are impressed on the emitter and collector resistors.

BACKGROUND OF THE INVENTION

Field of the invention

This invention relates to semiconductor amplifiers and more particularly semiconductor differential amplifiers prepared in integrated circuit configurations and which are designed so that no level shift occurs between the input and output signals thereof.

Description of the prior art

A semiconductor differential amplifier may generally be constructed in the form of an integrated circuit configuration by the use of diffusion technique of impurities into a semiconductor substrate to form PN junctions therebetween. Integrated circuit configurations of this nature provide greater advantages in the formation of active elements rather than passive elements. These advantages arise due to the fact that the active elements, such as transistors and diodes whether fabricated in their discrete forms or in the forms of integrated circuits, when formed in the same operation provide no difference in their characteristics and accuracies.

On the other hand, the passive elements, such as resistors and capacitors, fabricated in the form of integrated circuit elements are disadvantageous since they require large areas on semiconductor material for their formations. The occupied semiconductor area may be generally large enough for forming more than one active element therewith. The fabrication of the passive elements into integrated circuits are further disadvantageous since their characteristic values tend to vary in accordance with the fabricating conditions thereof and are hard to fix to desired values.

In case of a resistor, about ±20% of error in the resistance may be presented by the fabrication thereof using integrated circuit technology. The occupied area on semiconductor material by a several kilo-ohm resistor, for example, may exceed the area required by at least a monolithic transistor. In case of capacitors, they need larger semiconductor areas than those of resistors. Therefore, it is preferred to eliminate the use of passive elements especially capacitors wherever possible, and to use direct connection configurations.

A transistor differential amplifier is quite usable in such a direct connection configuration in semiconductor amplifiers. Unfortunately, most known differential amplifiers provide a level shift between its input and output signal levels. It has been necessary heretofore to eliminate such the level shift in a differential amplifier by combining a plurality of differential amplifiers together in a direct connection configuration. In such direct connection configurations, the most conventional means for eliminating the level shift is to provide an adjusting or compensating resistor in the collector circuit of the differential amplifier.

Generally the level shift is caused by voltage drops across the emitter-base junctions of the constituent transistors of the differential amplifier. The resistance of the compensating resistor, therefore, must be designed to have a specific value so as to obtain a proper voltage drop that will compensate for the drop across the emitter-base junctions of the constituent transistors. However, as explained above, the resistance of the compensating resistor is difficult to fix to a desired value, by integrated circuit technology, so that the compensation by the resistor may become insufficient due to an error in the resistance value. Moreover even if the compensating resistor could be prepared to have the desired resistance value, the compensation would become insufficient since the resistance value of the resistor is affected by such condition as changes in ambient temperature, current level of the transistor, etc.; differently than are the emitter-base junctions of the constituent transistors.

SUMMARY OF THE INVENTION

Accordingly, one of the objects of the present invention is to provide a differential amplifier capable of being formed into direct connection configurations, and which provide no level shift between the input and output signal levels thereof.

Another object of the invention is to provide a semiconductor amplifier which contains a multiplicity of unit differential amplifiers directly connected to each other by using simplified level shift compensating means and which employs a minimum number of resistors having a simple ratio relation between the resistance values thereof that is maintained despite changes in operating conditions.

The foregoing and other objects, advantages, manner of operation and novel features of the present invention will be best understood from the following detailed description when read in connection with the accompanying drawings, in which like reference numerals refer to like parts, and in which:

Figure 1:
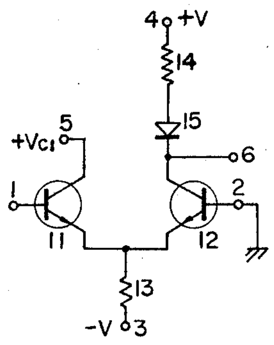
FIGS. 1 to 7 inclusive are circuit diagrams showing different embodiments of differential amplifier circuits constructed according to the present invention.

In order to attain the objects of the present invention, active diode means are used in at least one of the collector circuits of the constituent transistors of the differential amplifier as the level shift compensating means.

DETAILED DESCRIPTION OF THE PREFERRED EMBODIMENTS

The principle of the present invention is best described by referring to the embodiments of the present invention shown in the several figures of the drawings. The embodiment of the invention shown in FIG. 1 comprises an unbalanced type differential amplifier formed by a pair of NPN amplifying transistors 11 and 12 having the same characteristics and structures. The emitters of the pair transistors 11 and 12 are commonly connected to each other and an emitter resistor 13 is connected by one end thereof to the junctures of the two emitters. The other end of the emitter resistor 13 is connected to a negative terminal 3 of a voltage source (not shown) by which a negative voltage −V is impressed. 15 is a PN junction diode whose N region or cathode is connected to the collector of the transistor 12 and whose P region or anode is connected to one end of a load resistor 14 having a resistance twice as large as that of the emitter resistor 13. The other end of the load resistor 14 is connected to a positive terminal 4 of a voltage source by which a positive voltage +V is impressed thereon. The negative voltage −V and positive voltages +V have the same magnitude but have opposite polarities to each other.

As one of the primary features of the present invention, the PN junction diode 15 is designed to provide the same voltage drop thereacross as the voltage drop obtained across the emitter-base junctions of the transistors 11 and 12, additionally, the resistors 13 and 14 are designed to have a simple resistance ratio, i.e. 1:2 with respect to their resistance value. 5 is a terminal of a voltage source for supplying a positive voltage $+Vc_1$ to the collector of the transistor 11 as an operating bias therefor. Both the bases of the transistors are provided with input terminals 1 and 2 and the collector of the transistor 12 is provided with an output terminal 6. In the unbalanced type differential amplifier of FIG. 1, the input terminal 2 is grounded and only one input terminal has an input signal impressed thereon.

In operation, when the input signal applied to input terminal 1 is zero the base currents flowing in the respective base circuits of the transistors 11 and 12 become negligibly small and the same current I may flow through the respective transistors 11 and 12. This current I provides the same voltage drop $Vo$ across both the emitter-base junctions of the transistors 11 and 12 and the PN junction of the PN junction diode 15, respectively. Consequently, the potential at the input terminal 1 becomes equal to the potential of the input terminal 2 which is grounded. This potential at the input terminal 1 is expressed by the following equation:

$$V_1=V+2IR+Vo=0 \quad (1)$$

where R represents the resistance of the emitter resistor 13 and $V_1$ represents the potential at input terminal 1.

In the load circuit of the transistor 12 there is a series circuit formed by the collector resistor 14 and the PN junction diode 15 which provides thereacross a voltage drop $Vo+2IR$. The potential, $Vc_2$, at the output terminal 6 is, therefore, expressed by the following equation:

$$Vc_2=V-(Vo+2IR) \quad (2)$$

From a comparison of Equations 1 and 2, it will be appreciated that when $V_1=0$, then $Vc_2$ becomes zero potential, so that no level shift is provided by the embodiment of the invention shown in FIG. 1.

Figure 2:
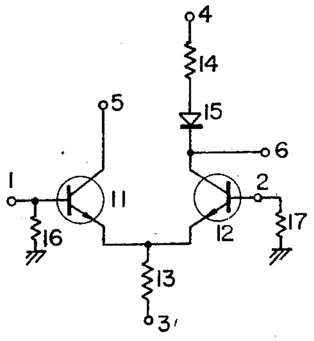

Although the potentials at the input terminals 1 and 2 are at ground potential in the case of the embodiment of FIG. 1, this invention may also be applicable to such a device in which a certain bias voltage is applied to the input terminals 1 and 2. One such circuit configuration is shown in FIG. 2 wherein the circuit is similar to that of FIG. 1 except that resistors 16 and 17 are inserted in the base circuits of the pair of transistors 11 and 12. With the circuit arrangement of FIG. 2 the bias potential at the input terminals should be approximately midway between the source voltages applied at the terminals 3 and 4.

Figure 8:
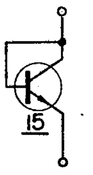
FIG. 8 is a schematic circuit diagram showing one example of a level shift compensating means employed in the differential amplifiers of the present invention.

To obtain the PN junction diode 15, there are a number of various ways available in the art. One of the preferred embodiments of such diode 15 is to directly interconnect the base and collector of a transistor (which may be fabricated in the same manufacturing process as the constituent transistors 11 and 12 of the differential amplifier) as shown in FIG. 8. Such a use of a transistor 15 to form the diode means is quite essential in the manufacture of the differential amplifier according to the present invention, otherwise it is quite difficult to obtain PN junction diode means having a PN junction which is capable of providing the same voltage drop thereacross as that obtained across the emitter-base junctions of the transistors 11 and 12.

The PN diode means 15 may also be obtained by diffusion of P type inmpurity into a N type semiconductor substrate that serves as the collector of the transistor 12. This should be accomplished during the same manufacturing process in which a P type base region is formed in the N type collector region. By this means the PN diode means is integrally interconnected to the transistor 12. In the latter case, however, it is necessary to design the PN diode means to have a somewhat larger PN junction area than that of the emitter-base junction of the transistor 12 to provide the same compensating voltage drop thereacross, respectively.

As stated before in integrated circuit devices, the resistance of a resistor element is not easily fixed so that it is maintained at a certain value. According to the present invention effects of such changes in resistance value of the conventional devices of this nature can be eliminated since this invention requires the emitter and load resistors to have a simple ratio relationship in their resistance values. Therefore, such resistors may be mechanically produced without fear of critical adjustments of the resistance values with respect to each other.

One of the most useful ways for forming the resistors 13 and 14 is to prepare three emitter resistors in the same manufacturing process, such as one simultaneous diffusion, which results in substantially the same errors (if any) being formed in the respective resistors produced.

Therefore, the errors caused by production variations from batch to batch may be neglected. Once three such emitter resistors are obtained, two of them can be connected together to serve as the collector resistor by being serially connected each to the other.

Figure 3:
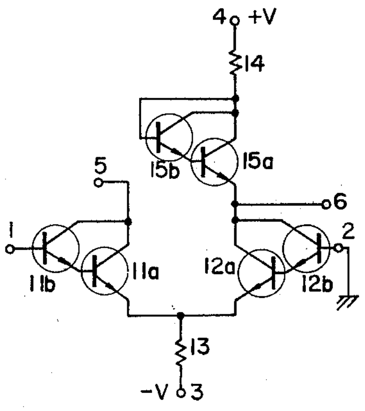

It is also a well known integrated circuit manufacturing technique that a transistor may be formed into a multi-stage transistor circuit. Such technique can also be introduced in the present invention. In FIG. 3, a plurality of Darlington transistor circuits 11*a*, 11*b*; 12*a*, 12*b* and 15*a*, 15*b* are shown as equivalents for the amplifying transistors 11 and 12 and the PN junction diode 15 of the circuit of FIG. 1. The emitter of transistor 11*b* is connected to the base of transistor 11*a* and the collectors of the transistors 11*a* and 11*b* are connected together to the terminal 5. The input terminal 1 is provided at the base of the transistor 11*b*. The other Darlington transistor circuits are respectively constructed in a similar manner to that described above with an exception that transistor 15*b* has its base connected to the collector to provide an equivalent diode element.

Figure 4:
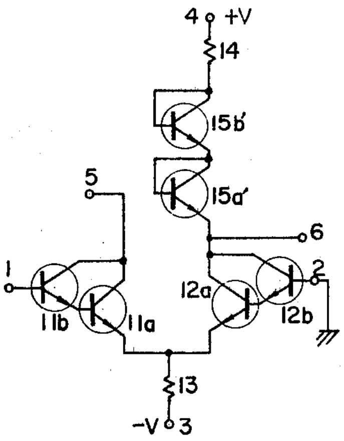

In FIG. 4 a modification of the circuit of FIG. 3 is shown wherein a series connection of a pair of diode means 15*a'* and 15*b'* is substituted for transistor circuit 15*a* and 15*b*.

The transistors 11*a*, 11*b*, 12*a*, 12*b*, 15*a*, 15*b*, 15*a'* and 15*b'* used in the circuit devices of FIGS. 3 and 4 are composed of transistors which are similar to each other, and the operation of each of the circuit devices is similar to that of the circuit devices of FIGS. 1 and 2.

This invention is also applicable to balanced type differential amplifiers as well as unbalanced types such as those described above. The latter employs only one input signal voltage which may be applied to either one of the input terminals of the pair of transistors comprising the unbalanced differential amplifier.

Figure 5:
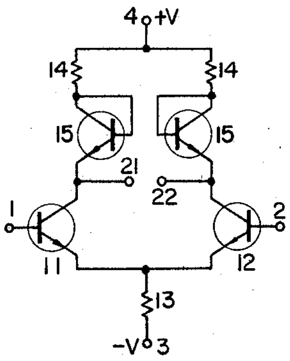

FIG. 5 shows one form of a balanced type differential amplifier embodying the present invention. In FIG. 5 a pair of series circuits comprised by a load resistor 14 and a diode means 15, are provided in the respective collector circuits of the pair transistors 11 and 12. Both the input terminals 1 and 2 are impressed with two different input signals respectively which are differently amplified, and output signals are obtained from the output terminals 21 and 22 provided at the respective collectors of transistors 11 and 12. The operation of the circuit of FIG. 5 is similar to that of the circuits described above, and the respective diode means 15 compensate the voltage drops across the emitter-base junctions of the transistors 11 and 12 in a similar manner.

Figure 6:
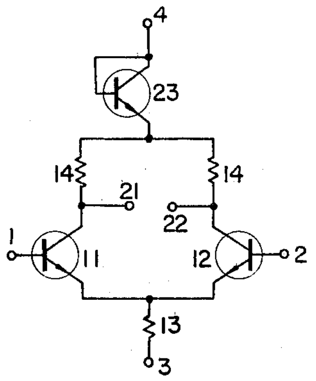

The circuit of FIG. 5 may be modified to provide a circuit such as that shown in FIG. 6 wherein a common diode means 23 is substituted for the two diode means 15 in the respective collector circuits of the transistors 11 and 12. This diode means 23 is prepared in a manner so as to have a PN junction which is twice as large as the emitter-base junction of the amplifying transistors, and it should be designed to provide the same voltage drop thereacross as that obtained across the emitter-base junctions of the respective amplifying transistors when the two collector currents flow therethrough. Apparently, the diode means 23 also has twice as large current capacity as that of either of the pair of transistors.

Figure 7:
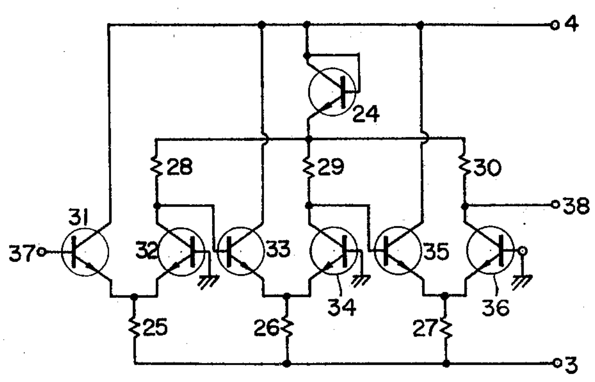

In FIG. 7, three unbalanced type differential amplifiers embodying the present invention are provided in which each of the three is comprised by pairs of transistors 31 and 32, 33 and 34, and 35 and 36.

Each of the differential amplifiers is provided with an emitter resistor in the common emitter circuit thereof, and a load resistor is connected to one of the collectors of the constituent pair of transistors in each differential amplifier stage. The respective emitter resistors 25 to 27 are commonly connected to the negative voltage terminal 3, and the collectors of the transistors 31, 33 and 35 are directly connected in common to the positive voltage terminal 4. The collectors of the transistors 32, 34 and 36 are respectively connected to load resistors 28 to 30 whose resistances are respectively twice as large as the emitter resistors of the corresponding differential emplifiers. 24 is an NPN transistor whose base and collector are short circuited together to form an equivalent diode circuit, which interconnects the respective load resistors 28 to 30 to the positive voltage terminal 4.

According to the embodiment of FIG. 7, the transistor 24 is specially made to provide the same voltage drop thereacross as that obtained across the respective emitter-base junctions of the transistors 31 to 36. To attain such a characteristic, in designing the circuit, the transistor 24 should be prepared with the same material under the same treating conditions as those required for formation of the transistors 31 to 36, and also it should be provided with a three times larger emitter-base junction than those of the transistors 31 to 36 provided the transistors 31 to 36 are the same.

The bases of the respective transistors 32, 34 and 36 are grounded. The collectors of the transistors 32 and 34 are connected to the bases of the transistors 33 and 35, respectively.

In operation, an input signal voltage is impressed on the input terminal 37 which is connected to the base of the transistor 31, and the output signal from the collector of the transistor 32 of the first stage differential amplifier is supplied to the base of the transistor 33 of the second stage. Similarly, the output signal of the second stage is applied to the third stage, and finally the output of the third stage is obtained from the output terminal 38 which is connected to the collector of the transistor 36. As apparent, there is no level shift between the input and output signals of the respective differential amplifier stages because of compensation by the transistor 24.

Preparation of the circuit of FIG. 7 in an integrated circuit configuration is performed, for example, in the following manner: preparing at least one N type region in a P type semiconductor substrate, forming in the N type region at least four P type regions that serve as the bases of the transistors 31, 33, 35 and 24, respectively, by diffusion of P type impurity and thereafter forming in the respective diffused P type regions a N type region that serves as the emitters of the transistors 31, 33, 35 and 24, respectively, by diffusion of N type impurity. Consequently, the first prepared N type region serves as the collectors of the transistors 31, 33, 35 and 24 and as the internal interconnecting means therebetween. Hence, the NPN transistors 31, 33, 35 and 24 are integrated in one N type region.

Further, in the first prepared N type region, P type impurity may be diffused. Since this P type region when formed is operatingly biased with a lower potential voltage than the voltage at the terminal 4, so that this P type region is isolated from the surrounding N type region by the PN junction formed therebetween and biased reversely. Therefore, the isolated P type region may be used as a resistor element.

From the foregoing description, it will be appreciated that by means of this invention, a new and improved semiconductor differential amplifier is provided. This amplifier has no level shift between its input and output signals. Furthermore, even if the transistor operating characteristics vary in accordance with changes in ambient temperatures under which the transistors are operating, such the operational change in the pair transistors are relatively compensated by the level shift compensating diode means since its operation is also varied correspondingly. Therefore, the circuit of the present invention also performs a temperature compensative function.

While the description of the present invention has been made with reference to NPN type transistors, it is believed obvious to one skilled in the art that the invention may also employ PNP type transistors and field effect transistors. Also as one modification of the circuit of FIG. 7, a multiplicity of the circuits of FIG. 1 may be used in series connection.

Having described several embodiments of a new and improved differential amplifier constructed in accordance with the invention, it is believed obvious that other modifications, variations and changes will be suggested to those skilled in the art. It is therefore to be expressly understood that any such modifications and changes that come within the spirit of the invention as defined by the scope of the appended claims, are intended to be covered.

I claim:

1. A semiconductor differential amplifier comprising:

a pair of amplifying transistors having the same characteristics and each having an emitter, a base, a collector; the emitters of said pair of transistors being connected together;

first and second voltage source terminals for providing an operating voltage therebetween, the bases of said pair of transistors being equally biased at a substantially middle potential of said operating voltage;

an emitter resistor connected between the commonly connected emitters and said first voltage source terminal;

at least one load resistor and diode means connected in series therewith between one of the collectors and said second voltage source terminal, said load resistor having a resistance value twice as large as that of said emitter resistor, and said diode means including a PN junction which operatingly provides thereacross the same voltage drop as that obtained across the emitter-base junctions of the transistors;

an input terminal provided on one of the bases for applying thereto an input signal; and an output terminal provided on said one collector for deriving therefrom an output signal, whereby no level shift occurs between levels of the input and output signals.

2. A semiconductor differential amplifier according to claim 1, wherein said diode means is made up of a transistor, which has the same construction and characteristics as said amplifying transistors and whose collector and base are short circuited to each other.

3. A semiconductor differential amplifier according to claim 2, wherein said transistor constituting said diode means is fabricated in the same manufacturing process as said pair of amplifying transistors.

4. A semiconductor differential amplifier according to claim 1, wherein the bases of said transistors are biased to ground potential, the other one of the collectors of said transistors being biased at a potential between the base bias potential and the potential at said second voltage source terminal, and said first and second voltage source terminals being provided with respective voltages of the same magnitude but of opposite polarity to each other, thereby obtaining an unbalanced type differential amplifier.

5. A semiconductor differential amplifier according to claim 4, wherein said diode means is made up of a transistor, which has the same construction and characteristics as said amplifying transistor and whose collector and base are short circuited to each other.

6. A semiconductor differential amplifier according to claim 1, wherein the base of one of said transistors is grounded through a first base resistor; wherein the base of said other transistor is grounded through a second base resistor which has the same resistance value as said first base resistor so that the bases are biased at the same potential from ground; and wherein the other one of the collectors of said transistors is connected to a voltage source having a potential between the base bias potential and the potential at the second voltage source terminal, thereby obaining an unbalanced type differential amplifier.

7. A semiconductor differential amplifyer according to claim 1, wherein each of said amplifying transistors consists of two unit transistors connected in Darlington configuration to each other; and wherein the diode means consists of first and second transistors, each having the same constructions and characteristics as those of said unit transistors, the first and second transistor being connected to each other in Darlington configuration and the base and collector of the Darlington configuration being connected together, so that there is provided across the emitter and collector of the Darlington configuration the same voltage drop as that produced between the base and emitter of the amplifying transistor consisting of unit transistors connected in the Darlington configuration.

8. A semiconductor differential amplifier according to claim 1, wherein each of said amplifying transistors consists of two unit transistors connected in Darlington configuration to each other; and wherein said diode means consists of first and second transistors each having the same constructions and characteritsics as those of said unit transistors, said first and second transistors each having their base and collector connected together and being connected in series to each other, thereby providing across the series circuit of the first and the second transistors the same voltage drop as that produced across the amplifying transistor.

9. A semiconductor differential amplifier according to claim 4, wherein each of said amplifying transistors consists of two unit transistors connected in Darlington configuration to each other; and wherein said diode means consists of first and second transistors, each having the same constructions and characteristics as those of said unit transistors, said first and second transistors each having their base and collector connected together and being connected in series to each other, thereby providing across the series circuit of the first and the second transistors the same voltage drop as that produced across the amplifying transistor.

10. A semiconductor differential amplifier according to claim 7, wherein each of said doide means is made up of a transistor which has the same construction and characteristics as said amplifying transistor and has its base and its collector connected to each other.

11. A semiconductor differential amplifier according to claim 7, wherein each of said amplifying transistors consists of two unit transistors connected in Darlington configuration to each other; and wherein the diode means consists of first and second transistors, each having the same constructions and characteristics as those of said unit transistors, the first and second transistors being connected to each other in Darlington configuration and the base and collector of the Darlington configuration being connected together, so that there is provided across the emitter and co.lector of the Darlington configuration the same voltage drop as that produced between the base and emitter of the amplifying transistor formed in the Darlington configuration.

12. A semiconductor differential amplifier according to claim 7, wherein each of said amplifying transistors consists of two unit transistors connected in Darlington configuration to each other; and wherein said diode means consists of first and second transistors, each having the same constructions and characteristics as those of said unit transistors, said first and second transistors each having their base and collector connected together and being connected in series to each other, thereby providing across the series circuit of the first and the second transistors the same voltage drop as that produced across the amplifying transistor.

13. A semiconductor differential amplifier, comprising:

a pair of amplifying transistors having the same characteristics and connected at their emitter to each other, the bases of the transistors being provided with input terminals and the collectors of the transistors being provided output terminals;

first and second voltage source terminals providing an operating voltage therebetween for supplying an operating current to said amplifying transistors;

an emitter resistor connected between the first source terminal and the commonly connected emitters of said transistors;

first and second load resistors connected at one end thereof, respectively, to the collectors of the transistors and at the other end thereof being connected together, each of said load resistors having a resistance value twice as large as that of said emitter resistor; and diode means connected between the second voltage source terminal and the commonly connected other ends of said load resistors forwardly with respect to the operating voltage, said diode means being made up of a transistor fabricated in the same manufacturing process as the amplifying transistors to have an emitter-base junction substantially twice as large in size as that of the emitter-base junctions of said amplifying transistors and having its base and its collector connected to each other so as to operatingly provide thereacross the same voltage drop as produced across the emitter-base junctions of respective amplifying transistors, said operating voltage being so determined that the potential at the input terminals lies substantially midway between the potentials of the first and second source terminals, whereby the output signal obtained exhibits no level shift with respect to the input signal level from the output terminal.

14. A semiconductor amplifier according to claim 1, wherein there is a series circuit of the load resistor and the diode means in each of the collector circuits of the pair of transistors, wherein there are two input signal impressing means each provided to each of the bases of the transistors, and wherein there are two output means provided at the respective collectors of the transistors thereby providing a balanced type amplifier.

15. A semiconductor amplifier according to claim 1 wherein there are a serially arranged multiplicity of pairs of amplifying transistors their associated emitter resistors and collector resistors providing a multi-stage amplifier, one of the bases of the amplifying transistors of the first stage being supplied with an input signal, the output signal obtained from the output means of each successive stage being supplied to the input means of its following stage, whereby a direct connection configuration of multistage amplifiers is obtained.

16. A semiconductor amplifier according to claim 15, wherein said diode means is connected commonly to the respective collector resistors and the PN junction of said diode means has a current capacity which is multiple times larger than that of the respective emitter-base junctions of the transistors.

References Cited

UNITED STATES PATENTS 3,221,261 11/1965 Ertel ............. 330—30 X

OTHER REFERENCES

Electronic Design (II) pp. 36–41, Nov. 8, 1965.
Electronic Design (I), p. 38, June 21, 1965.

ROY LAKE, Primary Examiner

L. J. DAHL, Assistant Examiner

U.S. Cl. X.R.

330—38